US009578745B2

(12) United States Patent
Yoshikawa et al.

(10) Patent No.: US 9,578,745 B2
(45) Date of Patent: Feb. 21, 2017

(54) PRINTED WIRING BOARD, METHOD FOR MANUFACTURING PRINTED WIRING BOARD AND PACKAGE-ON-PACKAGE

(71) Applicant: IBIDEN CO., LTD., Ogaki-shi (JP)

(72) Inventors: Kazuhiro Yoshikawa, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/504,842

(22) Filed: Oct. 2, 2014

(65) Prior Publication Data

US 2015/0092356 A1 Apr. 2, 2015

(30) Foreign Application Priority Data

Oct. 2, 2013 (JP) .................................. 2013-207371

(51) Int. Cl.
*H05K 1/03* (2006.01)
*H05K 1/11* (2006.01)
(Continued)

(52) U.S. Cl.
CPC ............... *H05K 1/113* (2013.01); *H01L 25/00* (2013.01); *H05K 3/4007* (2013.01);
(Continued)

(58) Field of Classification Search
CPC .......... H01L 25/00; H01L 2224/16225; H01L 2924/15311; H05K 1/113; H05K 1/183; H05K 1/0271; H05K 1/144; H05K 1/112; H05K 3/4007; H05K 3/3473; H05K 3/282; H05K 3/244; H05K 3/4602; H05K 2201/096; H05K 2201/09854; H05K 2201/0347; H05K 2203/0577; H05K 2203/1383; H05K 2203/072; H05K 2203/03923

See application file for complete search history.

(56) References Cited

U.S. PATENT DOCUMENTS 5,241,133 A * 8/1993 Mullen, III ......... H01L 23/3121
174/526
8,641,913 B2 * 2/2014 Haba ................... H01L 21/4828
216/100
(Continued)

FOREIGN PATENT DOCUMENTS

JP 2003-008228 A 1/2003

OTHER PUBLICATIONS

U.S. Appl. No. 14/504,969, filed Oct. 2, 2014, Yoshikawa, et al.
U.S. Appl. No. 14/509,354, filed Oct. 8, 2014, Yoshikawa, et al.

*Primary Examiner* — Yuanda Zhang
*Assistant Examiner* — Michael Carter
(74) *Attorney, Agent, or Firm* — Oblon, McClelland, Maier & Neustadt, L.L.P.

(57) ABSTRACT

A method for manufacturing a printed wiring board includes forming a removable layer over first pads in central portion of an interlayer insulation layer to mount IC chip, forming on the interlayer and removable layers a resin insulation layer having openings exposing second pads in peripheral portion of the interlayer layer to connect second substrate, forming a seed layer on the resin layer, in the openings and on the second pads, forming on the seed layer a plating resist having resist openings exposing the openings of the resin layer with diameters greater than the openings, filling the resist openings with electrolytic plating such that metal posts are formed in the resist openings, removing the resist, removing the seed layer exposed on the resin layer, and removing the removable layer and the resin layer on the removable layer such that cavity exposing the first pads is formed in the resin layer.

20 Claims, 14 Drawing Sheets

(51) Int. Cl.
  *H05K 1/18* (2006.01)
  *H05K 3/02* (2006.01)
  *H05K 3/04* (2006.01)
  *H05K 3/18* (2006.01)
  *H01L 25/00* (2006.01)
  *H05K 3/40* (2006.01)
  *H05K 1/02* (2006.01)
  *H05K 1/14* (2006.01)
  *H05K 3/24* (2006.01)
  *H05K 3/28* (2006.01)
  *H05K 3/34* (2006.01)
  *H05K 3/46* (2006.01)

(52) U.S. Cl.
  CPC ............. *H01L 2224/16225* (2013.01); *H01L 2924/15311* (2013.01); *H05K 1/0271* (2013.01); *H05K 1/112* (2013.01); *H05K 1/144* (2013.01); *H05K 1/183* (2013.01); *H05K 3/244* (2013.01); *H05K 3/282* (2013.01); *H05K 3/3473* (2013.01); *H05K 3/4602* (2013.01); *H05K 2201/0347* (2013.01); *H05K 2201/096* (2013.01); *H05K 2201/09854* (2013.01); *H05K 2203/0392* (2013.01); *H05K 2203/0577* (2013.01); *H05K 2203/0723* (2013.01); *H05K 2203/1383* (2013.01); *Y10T 29/49156* (2015.01)

(56) References Cited

U.S. PATENT DOCUMENTS

| | | | |
|---|---|---|---|
| 2009/0127688 A1* | 5/2009 | Lee .................. | H01L 24/97 257/686 |
| 2010/0270067 A1* | 10/2010 | Choi .................. | H05K 3/245 174/267 |
| 2011/0175235 A1* | 7/2011 | Horiuchi ............ | H01L 23/49811 257/774 |
| 2011/0223383 A1* | 9/2011 | Goto .................. | C08G 59/621 428/141 |
| 2012/0008287 A1* | 1/2012 | Kim .................. | H01L 24/24 361/736 |
| 2012/0013000 A1* | 1/2012 | Haba .................. | H01L 21/565 257/737 |

\* cited by examiner

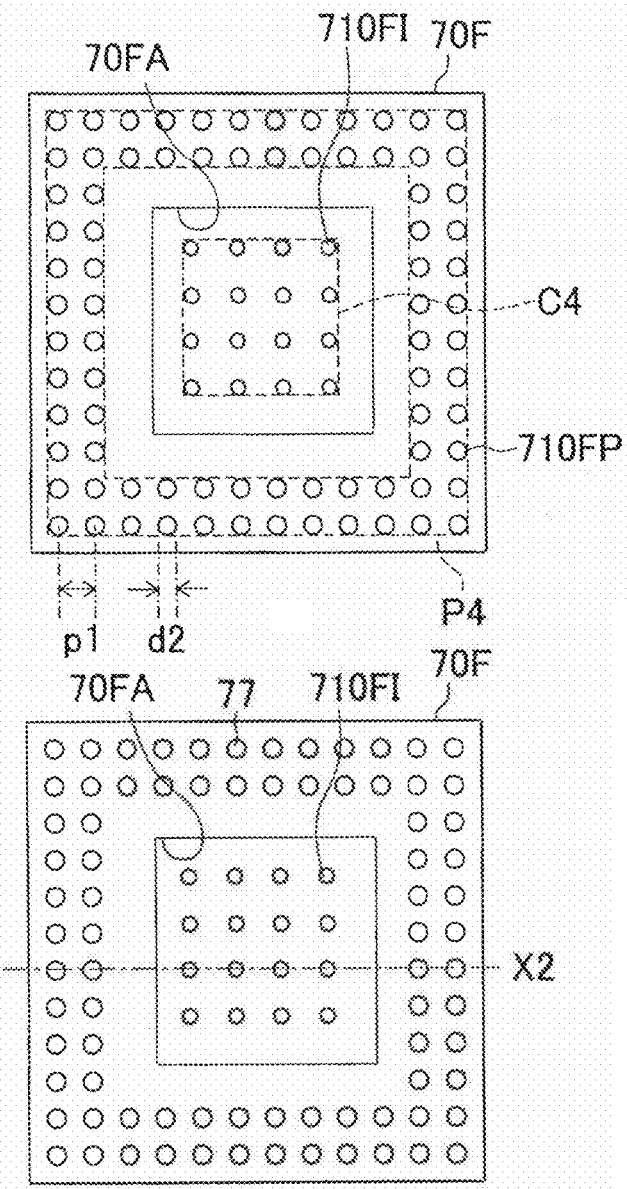

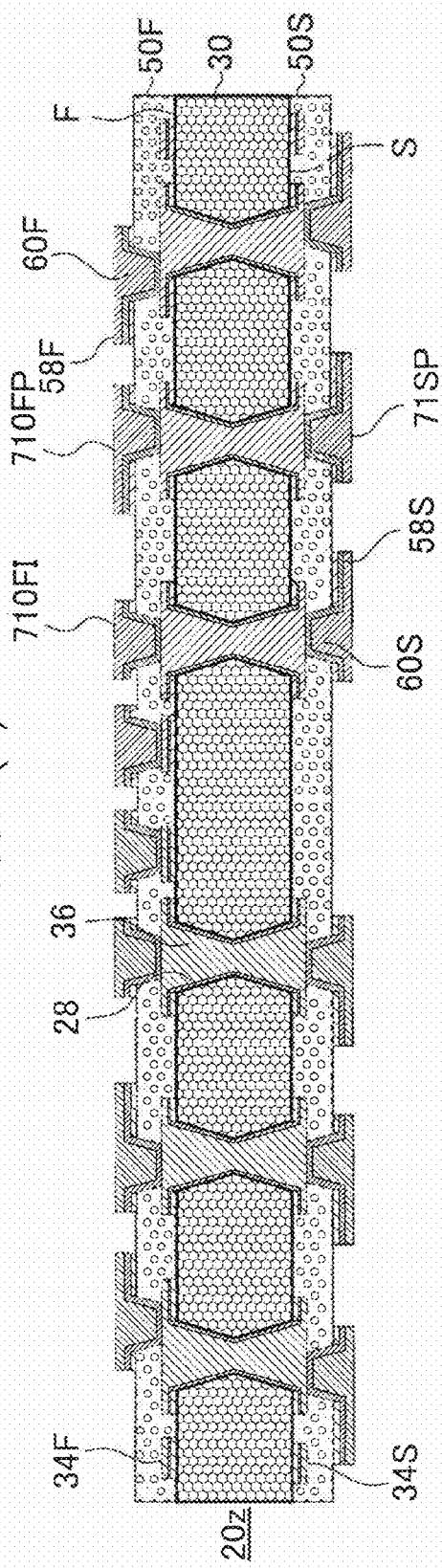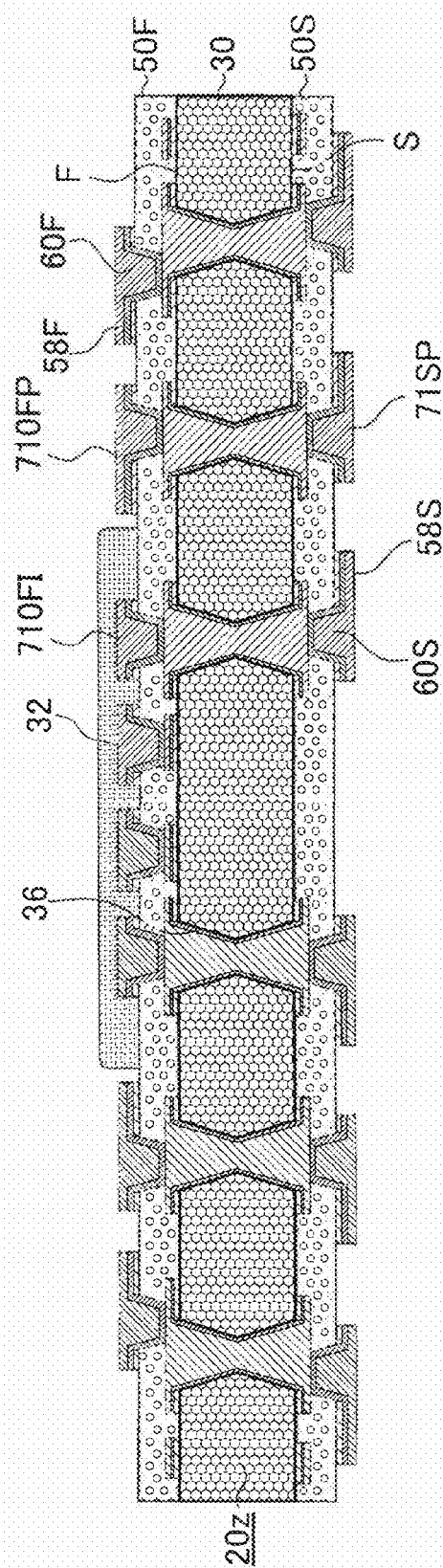

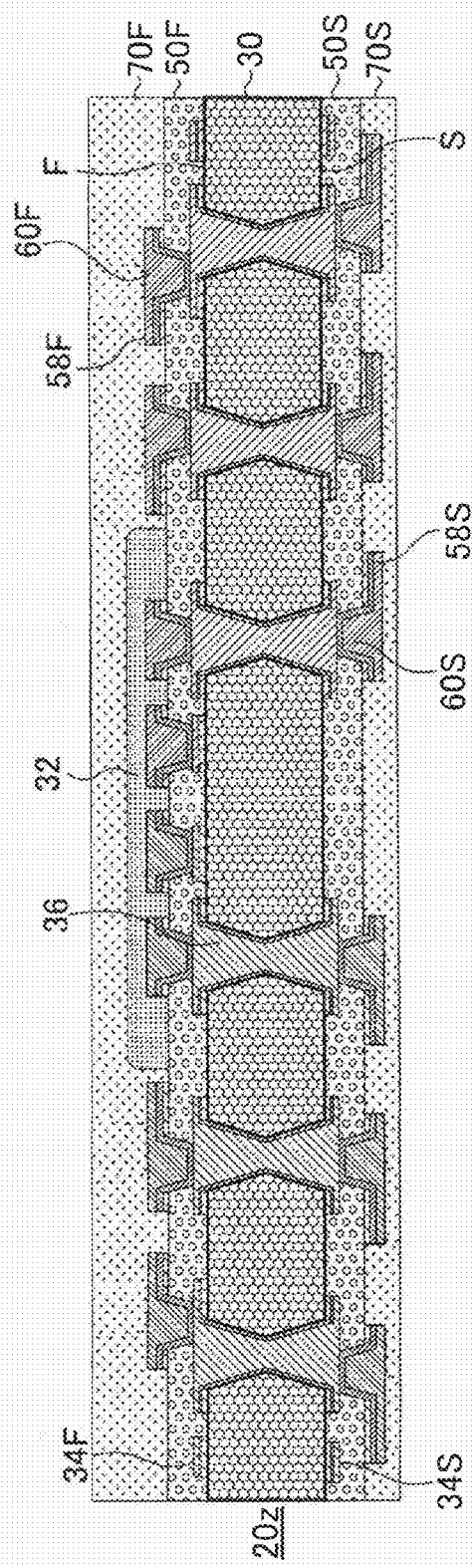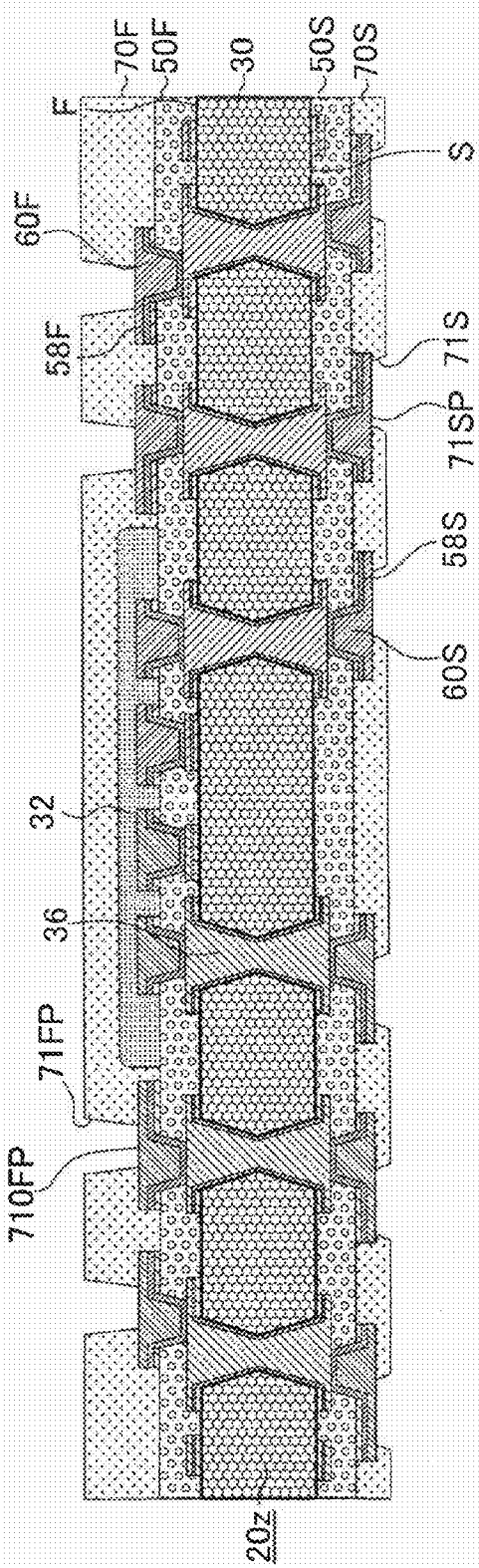

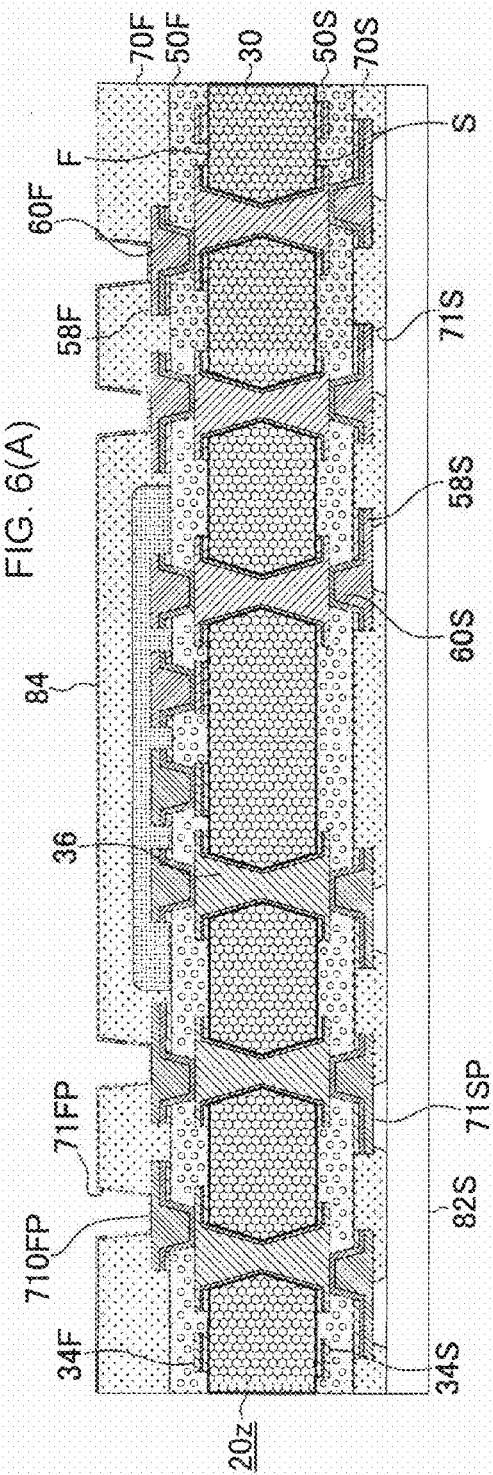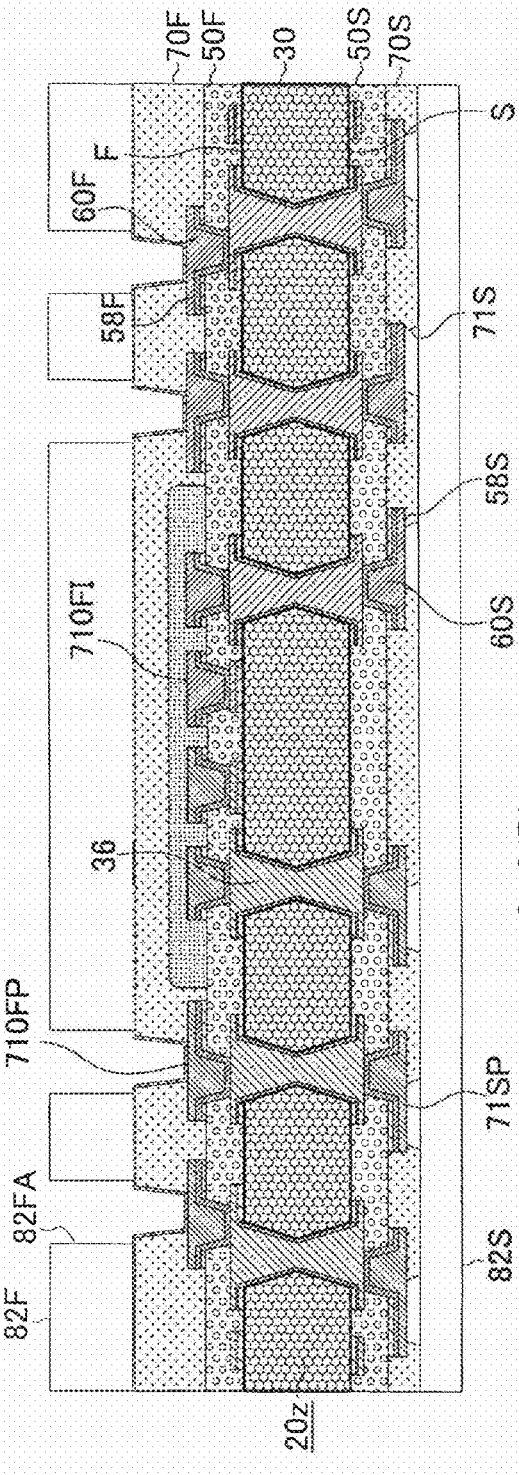

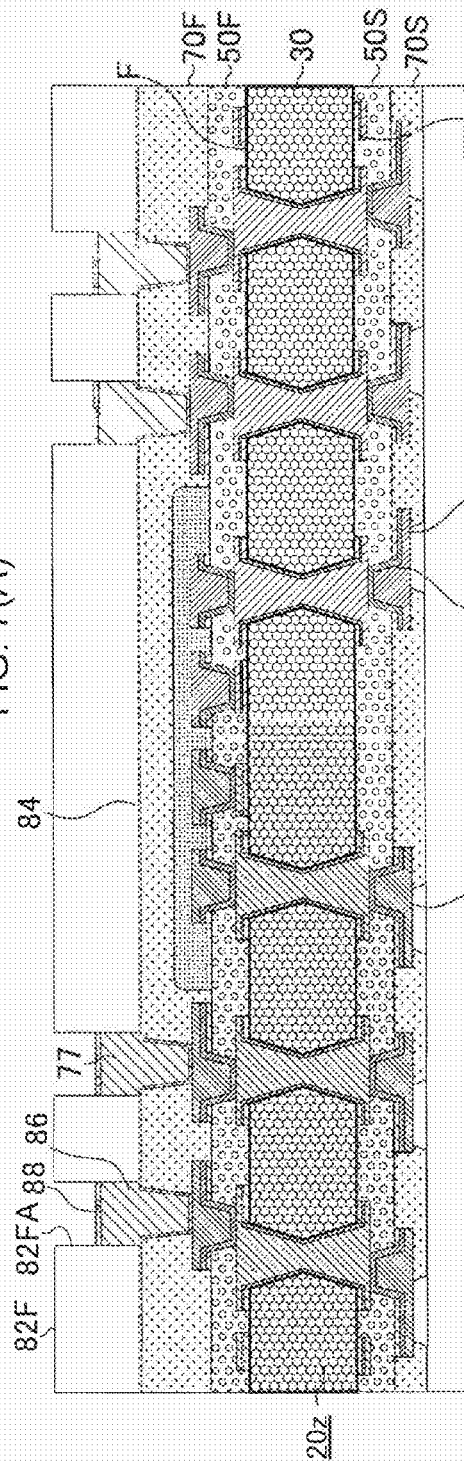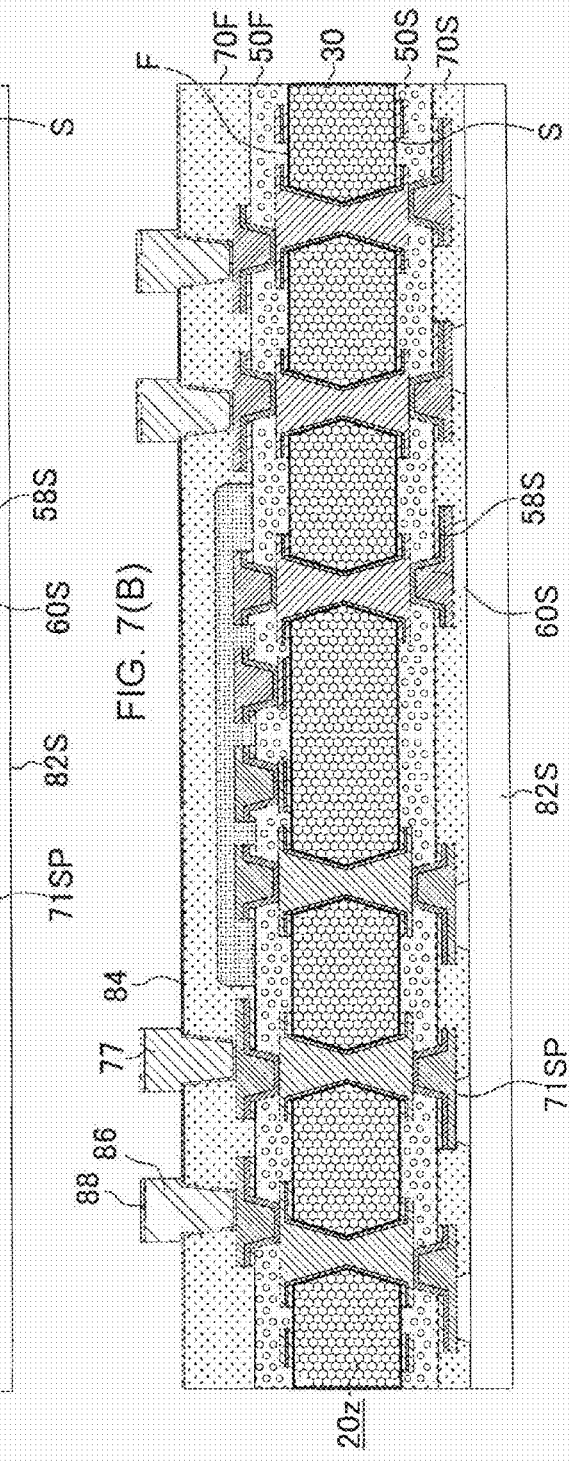

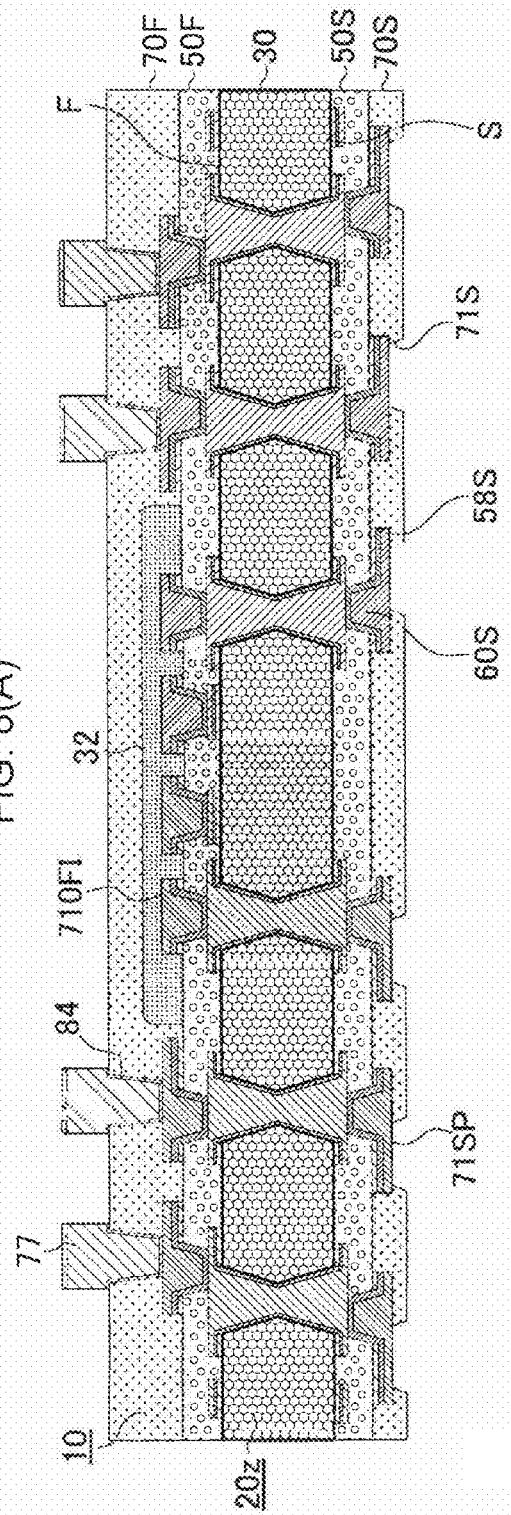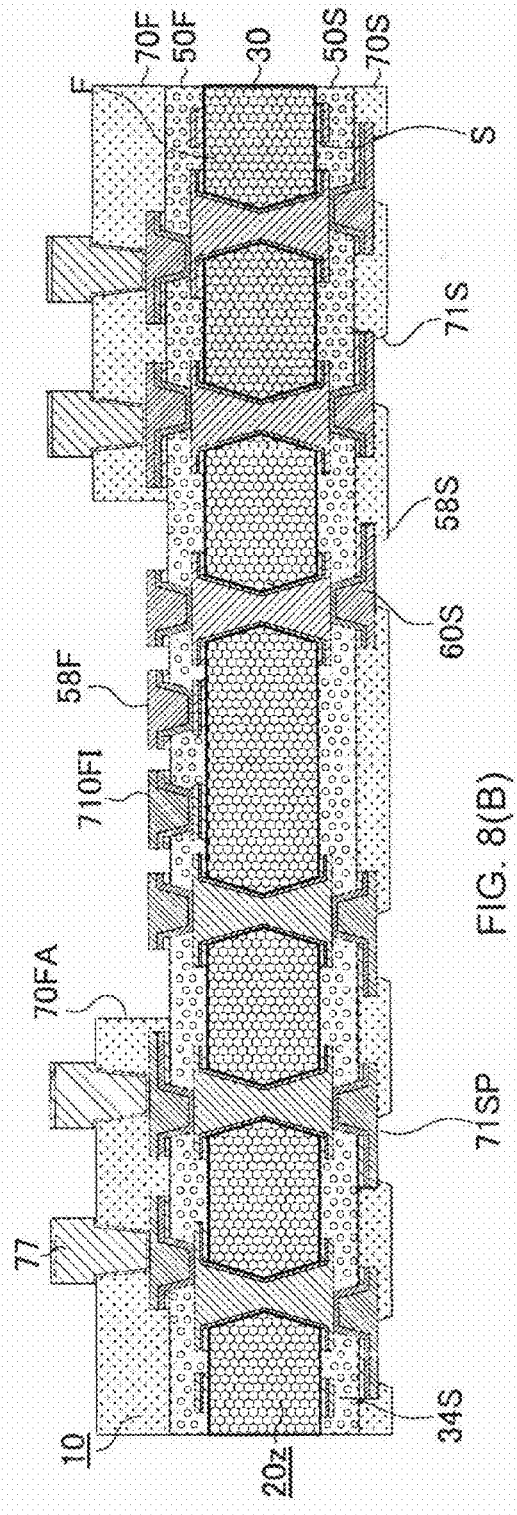

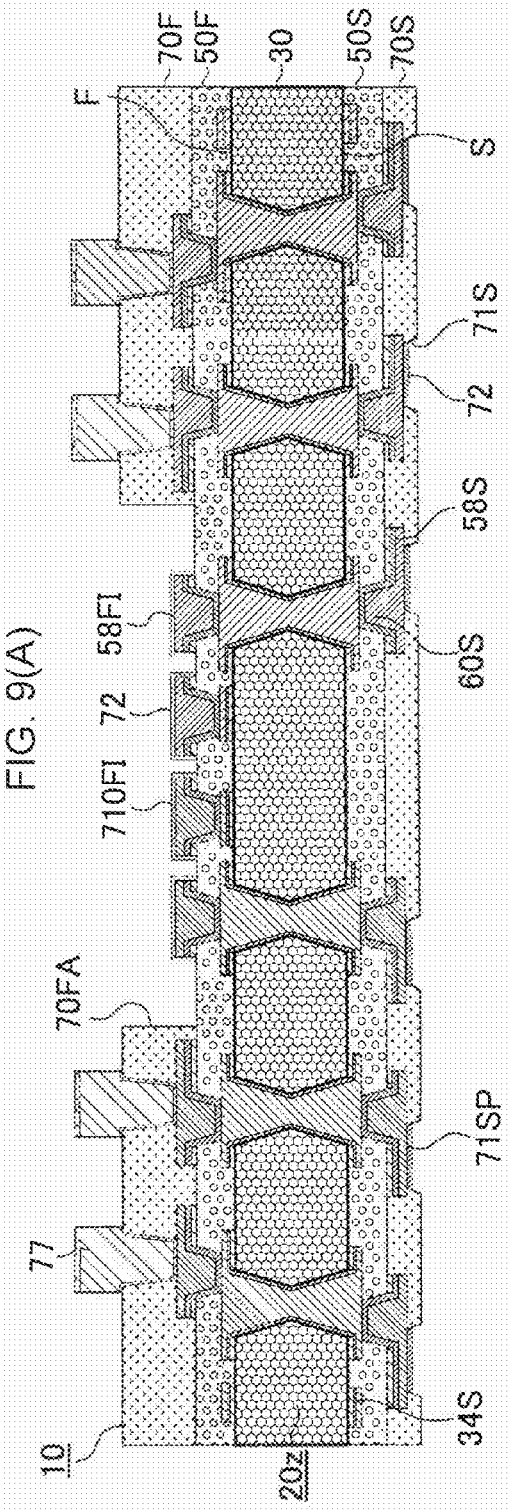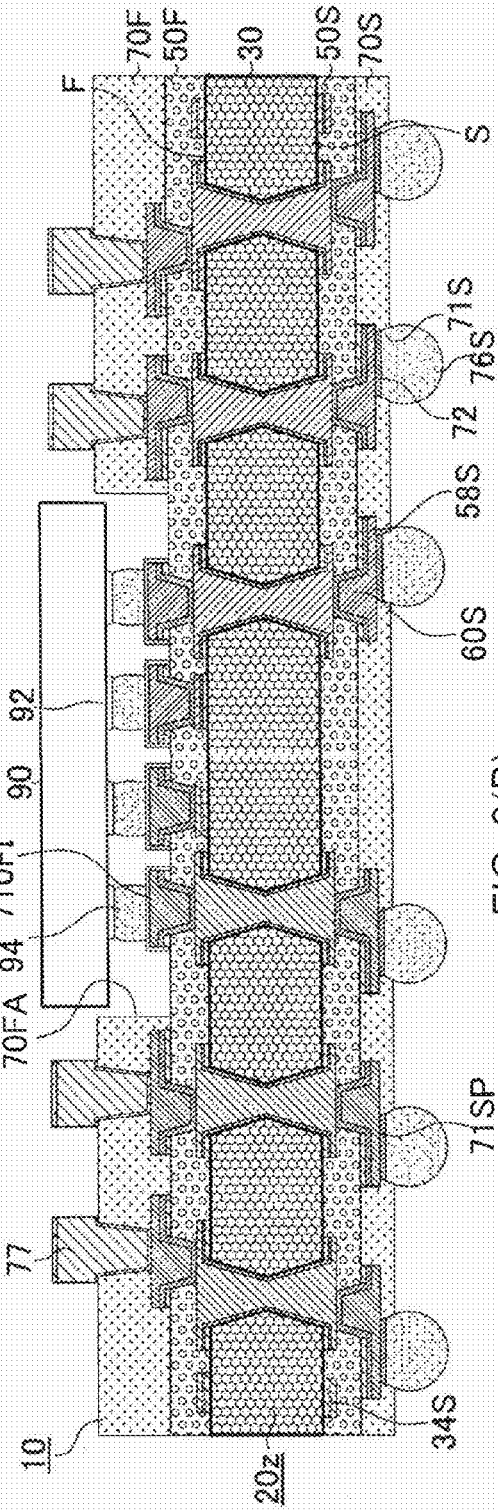

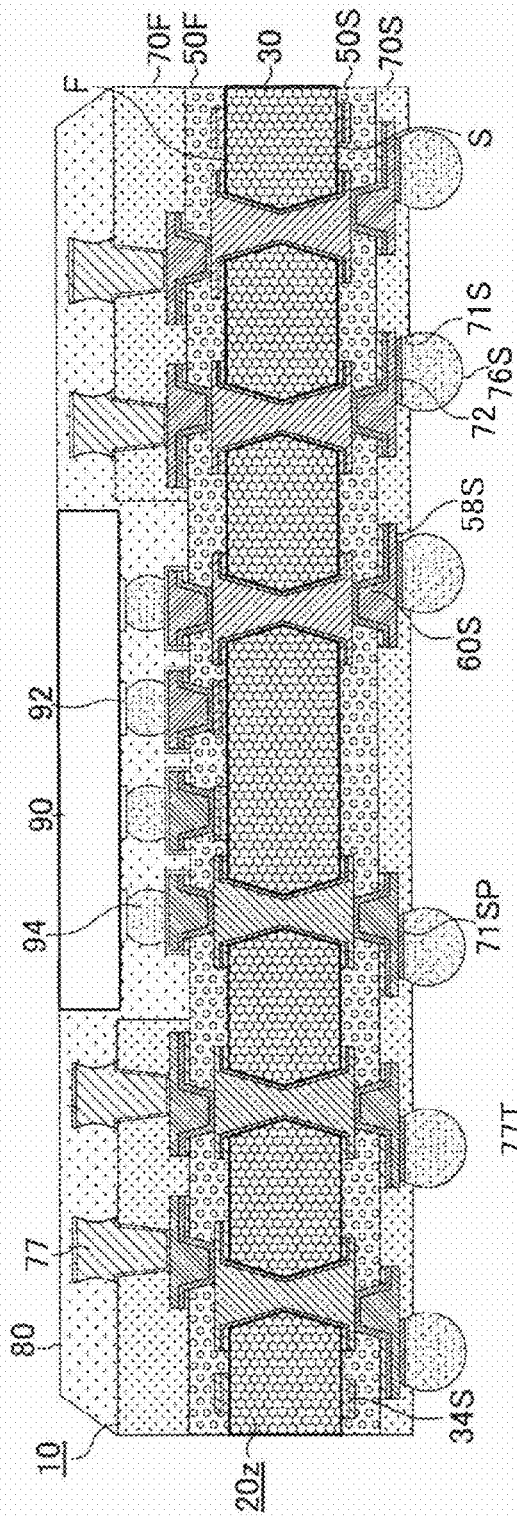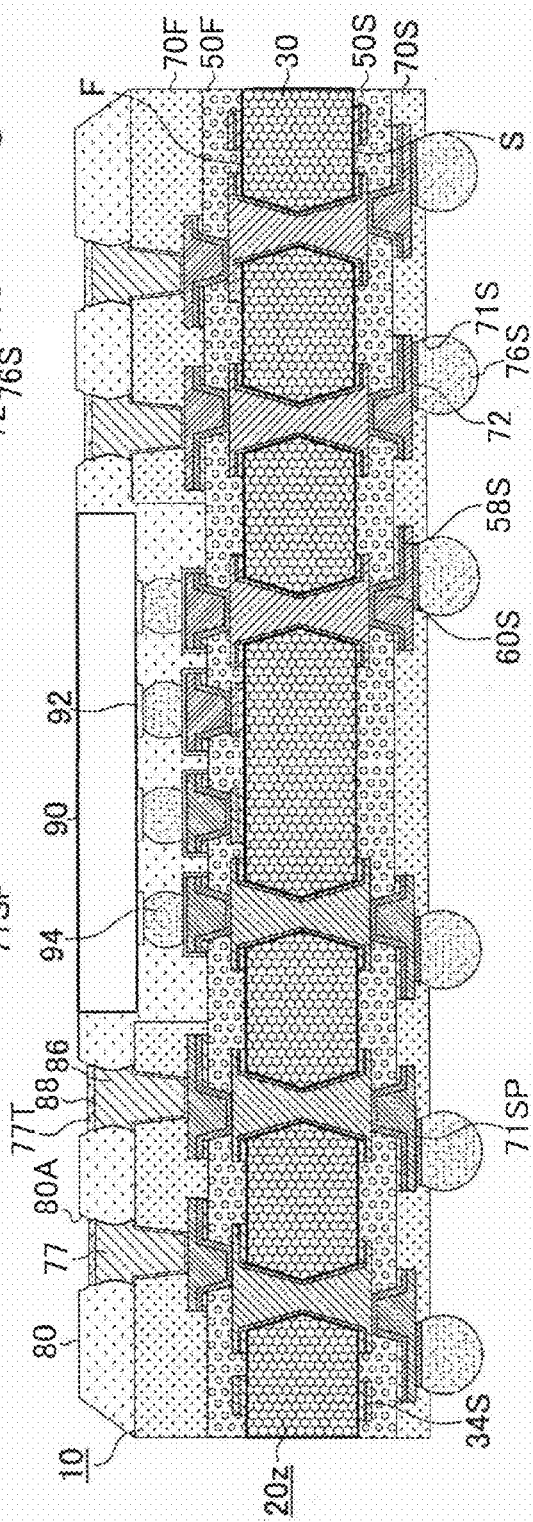

PRINTED WIRING BOARD, METHOD FOR MANUFACTURING PRINTED WIRING BOARD AND PACKAGE-ON-PACKAGE

CROSS-REFERENCE TO RELATED APPLICATIONS

The present application is based upon and claims the benefit of priority to Japanese Patent Application No. 2013-207371, filed Oct. 2, 2013, the entire contents of which are incorporated herein by reference.

BACKGROUND OF THE INVENTION

Field of the Invention

The present invention relates to a printed wiring board having metal posts for mounting another printed wiring board (upper substrate) and to a method for manufacturing such a printed wiring board.

Description of Background Art

JP2003-8228A describes a method for forming a metal post on a pad of a printed wiring board. The entire contents of this publication are incorporated herein by reference.

SUMMARY OF THE INVENTION

According to one aspect of the present invention, a method for manufacturing a printed wiring board includes forming a removable layer over first pads formed in a central portion of an interlayer resin insulation layer to mount an IC chip, forming on the interlayer resin insulation layer and on the removable layer a resin insulation layer having opening portions such that the opening portions expose second pads formed in a peripheral portion of the interlayer resin insulation layer to connect to a second substrate, forming a seed layer on the resin insulation layer such that the seed layer is formed on the resin insulation layer, in the opening portions and on the second pads exposed through the opening portions, forming on the seed layer a plating resist such that the plating resist has resist opening portions exposing the opening portions of the resin insulation layer and having diameters which are greater than the opening portions, respectively, filling the resist opening portions with electrolytic plating material via the seed layer such that metal posts are formed in the resist opening portions, respectively, removing the plating resist from the resin insulation layer, removing the seed layer exposed on the resin insulation layer by the removing of the plating resist, and removing the removable layer and a portion of the resin insulation layer on the removable layer such that a cavity portion exposing the first pads is formed in the resin insulation layer.

According to another aspect of the present invention, a printed wiring board includes an interlayer resin insulation layer, first pads formed on the interlayer resin insulation layer such that the first pads are positioned in a central portion of the interlayer resin insulation layer and to mount an IC chip, second pads formed on the interlayer resin insulation layer such that the second pads are positioned in a peripheral portion of the interlayer resin insulation layer and to connect to a second substrate, a resin insulation layer formed on the interlayer resin insulation layer and the first and second pads such that the resin insulation layer has a cavity portion exposing the first pads in the central portion of the interlayer resin insulation layer and opening portions exposing the second pads in the peripheral portion of the interlayer resin insulation layer, and metal posts formed on the second pads in the peripheral portion of the interlayer resin insulation layer, respectively.

According to yet another aspect of the present invention, a package-on-package device includes a first substrate, an IC chip mounted on the first substrate, a second substrate mounted on the first substrate, and a mold resin layer filling a space formed between the first substrate and the IC chip. The first substrate includes an interlayer resin insulation layer, first pads formed on the interlayer resin insulation layer such that the first pads are positioned in a central portion of the interlayer resin insulation layer and to mount an IC chip, second pads formed on the interlayer resin insulation layer such that the second pads are positioned in a peripheral portion of the interlayer resin insulation layer and to connect to a second substrate, a resin insulation layer formed on the interlayer resin insulation layer and the first and second pads such that the resin insulation layer has a cavity portion exposing the first pads in the central portion of the interlayer resin insulation layer and opening portions exposing the second pads in the peripheral portion of the interlayer resin insulation layer, and metal posts formed on the second pads in the peripheral portion of the interlayer resin insulation layer, respectively, the mold resin layer has opening portions exposing end portions of the metal posts, respectively, the first substrate has first bumps mounting the IC chip on the pad portions in the central portion of the interlayer resin insulation layer, and the second substrate has second bumps connecting to the end portions of the metal posts exposed from the opening portions of the mold resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3(A) is a plan view of a mounting surface, and FIG. 3(B) is a view showing a mounting surface with metal posts;

FIG. 4(A)-4(B) show steps for manufacturing metal posts of a printed wiring board according to the first embodiment;

FIG. 5(A)-5(B) show steps for manufacturing metal posts of a printed wiring board according to the first embodiment;

FIG. 6(A)-6(B) show steps for manufacturing metal posts of a printed wiring board according to the first embodiment;

FIG. 7(A)-7(B) show steps for manufacturing metal posts of a printed wiring board according to the first embodiment;

FIG. 8(A)-8(B) show steps for manufacturing metal posts of a printed wiring board according to the first embodiment;

FIG. 9(A)-9(B) show steps for manufacturing metal posts of a printed wiring board according to the first embodiment;

FIG. 14(A)-14(B) show steps for manufacturing metal posts of a printed wiring board according to the second embodiment.

DETAILED DESCRIPTION OF THE EMBODIMENTS

Figure 1:
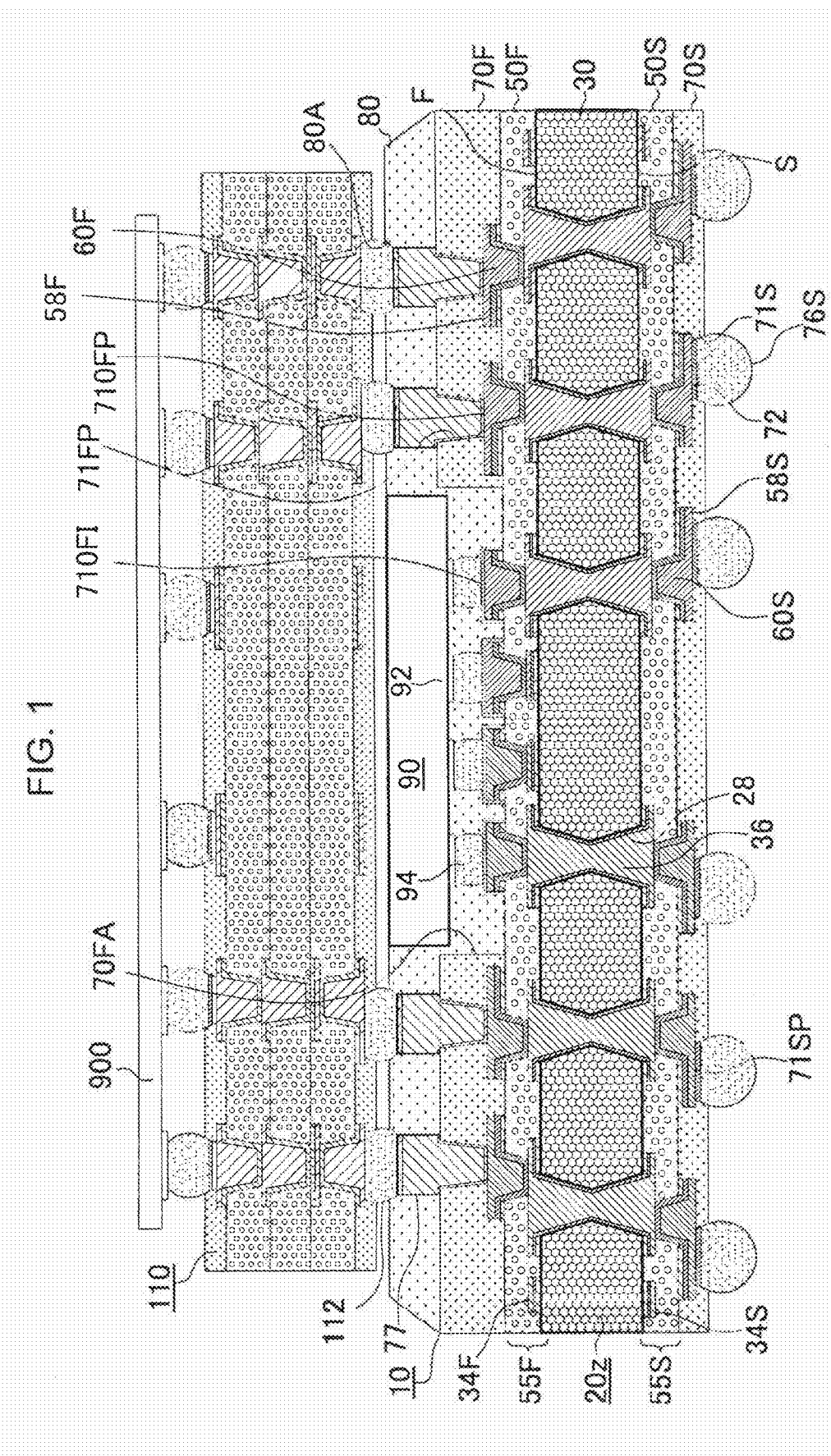
FIG. 1 shows a cross-sectional view of an applied example of a printed wiring board according to a first embodiment of the present invention.

The embodiments will now be described with reference to the accompanying drawings, wherein like reference numerals designate corresponding or identical elements throughout the various drawings.

First Embodiment

FIG. 1 shows an applied example of printed wiring board 10 according to a first embodiment of the present invention.

Printed wiring board 10 has pads (first pads) (710FI) for mounting electronic component 90 such as an IC chip, and pads (second pads) (710FP) for mounting another printed wiring board (upper substrate) 110. Electronic component 900 such as a memory is mounted on the other printed wiring board. Pad group (C4) is formed with multiple pads (710FI) (see FIG. 3(A)), and pad group (C4) is formed in the approximate center of printed wiring board 10. Pads (710FP) are formed in peripheral region (P4) surrounding pad group (C4) (see FIG. 3(A)). On pads (710FP), bonding posts (metal posts) 77 for mounting an upper substrate are formed. The shape of metal posts is a circular column, for example. Metal posts 77 work to electrically connect printed wiring board 10 and printed wiring board 110. In addition, even if pitch (p1) of pads (710FP) is 0.3 mm or less, the distance between printed wiring board 10 of the present embodiment and printed wiring board (upper substrate) 110 is secured by metal posts 77. Even if pitch (p1) of pads (710FP) is 0.25 mm or less, a constant distance is secured between printed wiring board 10 of the embodiment and printed wiring board (upper substrate) 110 by metal posts 77. Insulation is maintained between adjacent pads. Pitch (p1) is the distance between the centers of adjacent pads (710FP).

The printed wiring board of the present embodiment may have a core substrate, or it may be a coreless printed wiring board. A printed wiring board with a core substrate and its manufacturing method are described in JP2007-227512A, for example. The entire contents of JP2007-227512A are incorporated herein by reference. A coreless substrate and its manufacturing method are described in JP2005-236244A, for example.

Such a coreless substrate is formed by alternately laminating an interlayer resin insulation layer and a conductive layer, and all the interlayer resin insulation layers each have a thickness of 60 μm or less, for example.

Printed wiring board 10 of the first embodiment has core substrate 30. The core substrate has insulative base (20z) having first surface (F) and second surface (S) opposite the first surface, first conductive layer (34F) formed on first surface (F) of the insulative base and second conductive layer (34S) formed on second surface (S) of the insulative base. The core substrate is further provided with through-hole conductor 36 made by filling plating film in penetrating hole 28 for a through-hole conductor formed in insulative base (20z). Through-hole conductor 36 connects first conductive layer (34F) and second conductive layer (34S). The first surface of the core substrate corresponds to the first surface of the insulative base, and the second surface of the core substrate corresponds to the second surface of the insulative base.

Interlayer resin insulation layer (uppermost interlayer resin insulation layer) (50F) is formed on first surface (F) of core substrate 30. Conductive layer (uppermost conductive layer) (58F) is formed on interlayer resin insulation layer (50F). Conductive layer (58F) is connected to first conductive layer (34F) or a through-hole conductor by via conductor (uppermost via conductor) (60F) which penetrates through interlayer resin insulation layer (50F). Upper buildup layer (55F) is made up of interlayer resin insulation layer (50F), conductive layer (58F) and via conductors (60F). The upper buildup layer in the first embodiment is single layered. The uppermost conductive layer has pads (710FI, 710FP). Top surfaces of conductive circuits included in the uppermost conductive layer and top surfaces of via conductors make pads (710FI, 710FP).

Interlayer resin insulation layer (lowermost interlayer resin insulation layer) (50S) is formed on second surface (S) of core substrate 30. Conductive layer (lowermost conductive layer) (58S) is formed on interlayer resin insulation layer (50S). Conductive layer (58S) is connected to second conductive layer (34S) or a through-hole conductor by via conductor (lowermost via conductor) (60S) which penetrates through interlayer resin insulation layer (50S). Lower buildup layer (55S) is made up of interlayer resin insulation layer (50S), conductive layer (58S) and via conductors (60S). The lower buildup layer in the first embodiment is single layered. The lowermost conductive layer has BGA pads (71 SP) for connection with a motherboard. Top surfaces of conductive circuits included in the lowermost conductive layer and top surfaces of via conductors make pads (71SP).

Upper solder-resist layer (70F) is formed on the upper buildup layer, and lower solder-resist layer (70S) is formed on the lower buildup layer. In solder-resist layer (70F), cavity (70FA) to expose pads (710FI) and openings (71FP) to expose pads (710FP) are formed. Solder-resist layer (70S) has openings (71S) to expose BGA pads (71SP). On a BGA pad (71SP), solder bump (76S) is formed for connection with a motherboard. It is an option to use connection material such as Sn film or the like to replace a solder bump. Solder bump 94 of IC chip 90 is connected to pad (710FI).

Figure 2:
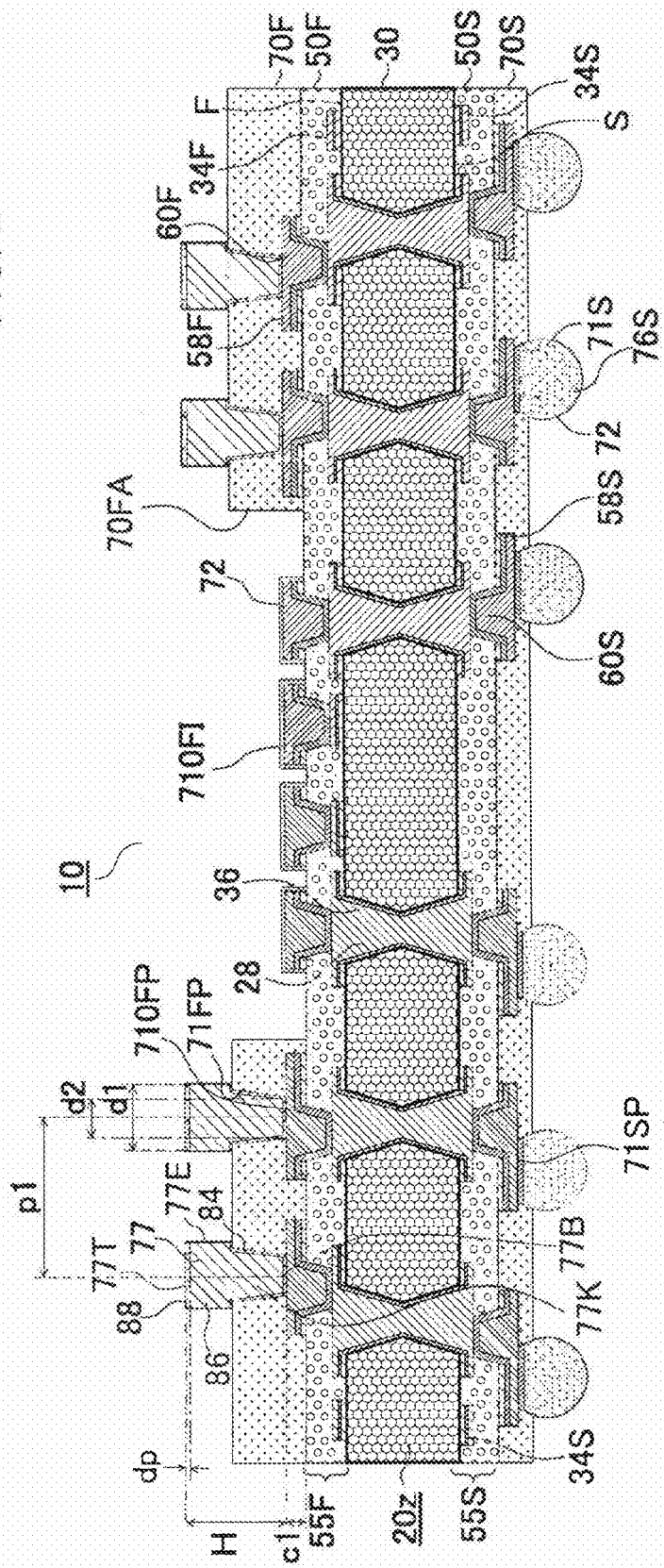
FIG. 2 shows a cross-sectional view of a printed wiring board according to the first embodiment.
Figure 10A:
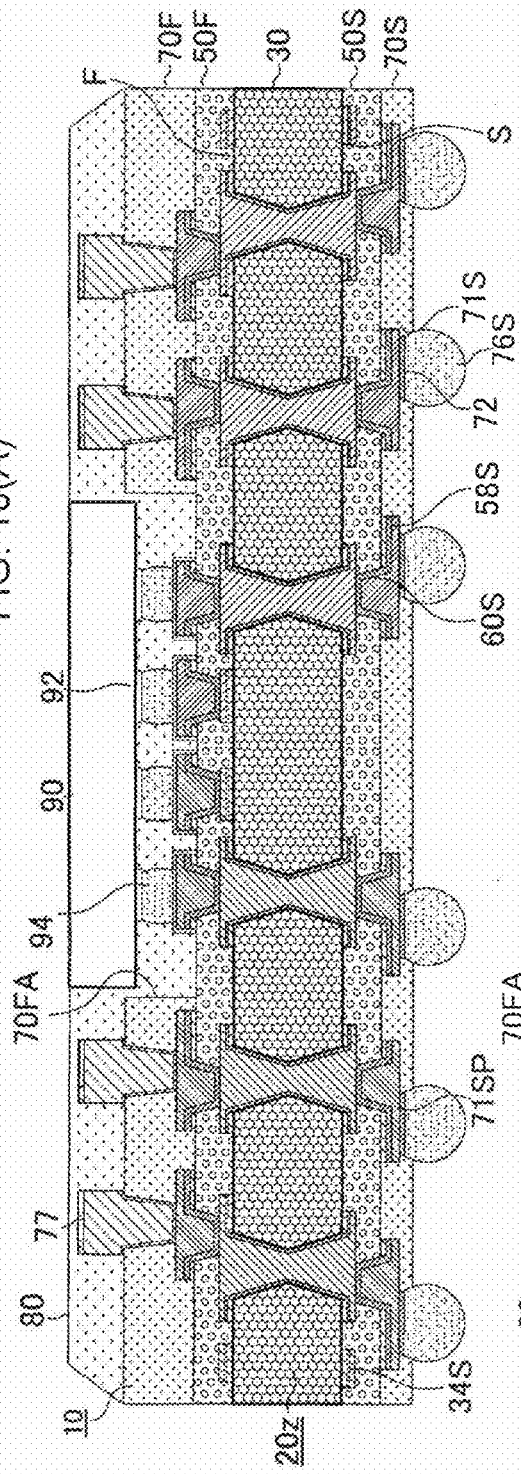
FIG. 10(A)-10(B) show steps for manufacturing metal posts of a printed wiring board according to the first embodiment.
Figure 10B:
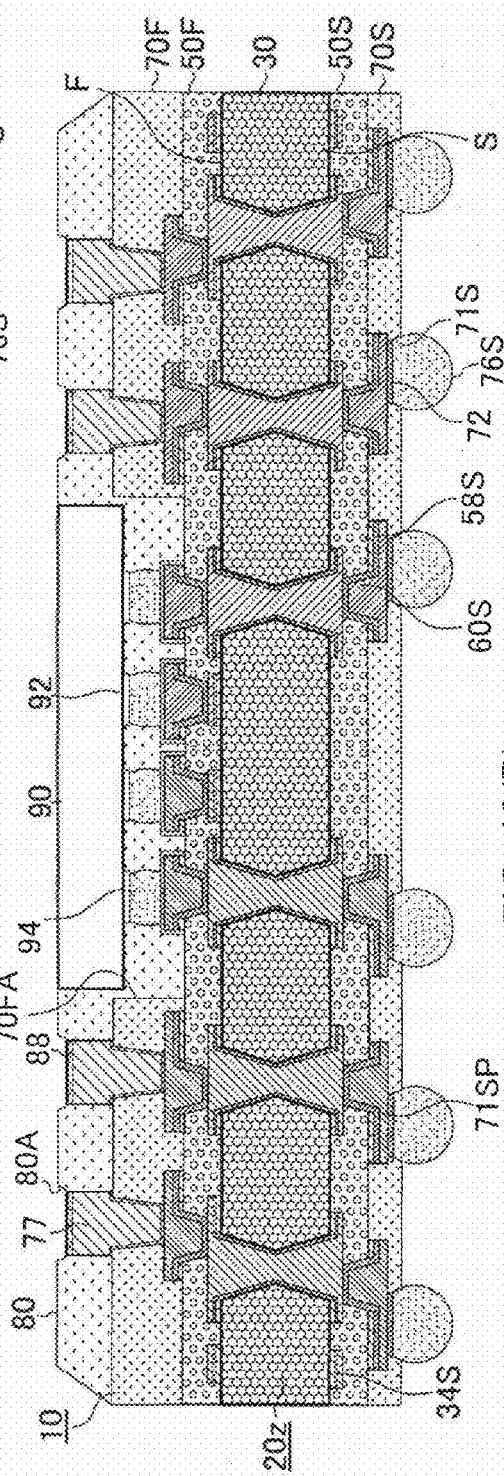

FIG. 2 is a cross-sectional view of printed wiring board 10 of the present embodiment having solder bumps (76S). Its mounting surface is provided with upper solder-resist layer (70F) and pads (710FI, 710FP). Metal post 77 is formed on pad (710FP).

A metal post 77 has top portion (77T) and its opposing bottom portion (77B). Solder-plated film 88 is formed on top portion (77T). Between top and bottom portions, metal post 77 has cylindrical portion (77E) exposed from solder-resist layer (70F) and beheaded-cone portion (77K) formed in opening (71 FP) of the solder-resist layer. Cylindrical portion (77E) and beheaded-cone portion (77K) are made of electrolytic plated film 86. Seed layer 84 is formed on the surface of beheaded-cone portion (77K). Bottom portion (77B) (the top portion of the beheaded-cone portion) of a metal post faces pad (710FP).

FIG. 2 shows a cross-sectional view of printed wiring board 10 taken at (X2-X2) in FIG. 3(B). Diameter (d2) of the portion of a metal post that is exposed from the solder resist (cylindrical portion (77E)) shown in FIGS. 2 and 3(B) is 45 μm~140 μm. The diameter of a pad is measured at the conductor (conductive circuit or via conductor) exposed from the solder-resist layer. Diameter (d1) of metal post 77

(the diameter of the top portion of a metal post) is set greater than diameter (d2). Diameter (d1) is set at 50 μm~150 μm. Regarding diameter (d2) of a pad and diameter (d1) of a metal post, the ratio (d2/d1) is preferred to be 0.5~0.9. If the ratio is set at such a range, the pitch between pads is reduced. Even if pitch (p1) is 0.3 mm or less, connection reliability is high between printed wiring board 10 and the upper substrate. Also, insulation reliability is high between metal posts. Distance (pitch) (p1) between adjacent pads (710FP) is 100 μm~300 μm. If pitch (p1) is less than 100 μm, insulation reliability between metal posts tends to decrease. Also, since such a pitch makes metal posts thinner, connection reliability decreases between the upper substrate and printed wiring board 10. If pitch (p1) exceeds 300 μm, the size of printed wiring board 10 increases. Accordingly, stress exerted on metal posts increases and connection reliability decreases between the upper substrate and printed wiring board 10.

When pitch (p1) is 0.3 mm or less, height (H) (distance from the top to the bottom end) of metal post 77 including the thickness of solder plated film (dp: 20 μm) is 75 μm~200 μm, and diameter (d1) of the metal post is 75 μm~150 μm. Connection reliability is enhanced between the printed wiring board of the embodiment and the upper substrate, and insulation reliability is improved between metal posts.

When pitch (p1) is 0.25 mm or less, height (H) of metal post 77 is 100 μm~200 μm, and diameter (d1) of metal post 77 is 50 μm~150 μm. Connection reliability is enhanced between the printed wiring board of the embodiment and the upper substrate, and insulation reliability is improved between metal posts.

The aspect ratio (height H/diameter d1) of a metal post is preferred to be greater than 1. A metal post with such a ratio mitigates stress between the printed wiring board of the present embodiment and the upper substrate, resulting in enhanced connection reliability. The aspect ratio (H/d1) is preferred to be 0.6~3. Stress is mitigated between the upper substrate and printed wiring board 10. In addition, the metal post does not deteriorate from fatigue, and connection reliability is enhanced between the upper substrate and printed wiring board 10.

Regarding distance (H) from the upper surface of pad (710FP) to the top portion of a metal post and thickness (c1) of pad (710FP), the ratio (H/c1) is preferred to be at least 5 but 30 or smaller. When pitch (p1) is 0.3 mm or less, the value of (H/c1) is preferred to be at least 7 but 25 or smaller. Since pad (710FP) is the base of a metal post, if the value of (H/c1) is too great, the metal post may break off from the pad or the reliability of the metal post may decrease. On the other hand, if the value of (H/c1) is too small, it is hard for the metal post to mitigate stress, and connection reliability decreases.

In the first embodiment, pitch (p1) can be reduced. Since there is enough space between adjacent metal posts, insulation reliability between metal posts is high even when pitch (p1) is 0.3 mm or less. Pitch (p1) at 0.25 mm or less makes metal posts thinner. To enhance connection reliability, the aspect ratio (H/d1) of a metal post is preferred to be 0.6 or greater. When the number of pads (710FP) increases, the size of the printed wiring board increases. However, a metal post with an aspect ratio (H/d1) of 2 or greater mitigates stress caused by differences in physical properties between the upper substrate and the printed wiring board. When the value of (H/d1) exceeds 3.5, the metal post deteriorates because of heat cycles. Examples of physical properties are a thermal expansion coefficient, Young's modulus and the like.

As shown in FIG. 1, printed wiring board 10 and upper substrate 110 are connected by highly rigid metal posts 77. Thermal stress between the upper substrate and the printed wiring board is mitigated by metal posts 77. Metal posts 77 maintain the strength of an electronic device that includes the upper substrate and the printed wiring board. The electronic device is suppressed from warping caused by physical property differences between the upper substrate and the printed wiring board.

Since first pads 710 are exposed from solder-resist layer (70F) of the printed wiring board according to the first embodiment, IC chip 90 is positioned inside cavity (70FA), thus reducing the distance between the first pads and the IC chip. Accordingly, metal posts 77 are set to be lower, and connection reliability is improved between upper substrate 110 and metal posts 77. In addition, since openings (71FP) of the solder-resist layer are filled with electrolytic plating to form a portion of each metal post, the metal posts are secured by highly rigid solder-resist layer (70F). Thus, the reliability of the metal posts is enhanced.

FIG. 4~10 show a method for manufacturing metal posts.

Printed wiring board 10 shown in FIG. 4(A) is manufactured using the aforementioned method described in JP2007-227512A, for example. On upper interlayer resin insulation layer (50F), printed wiring board 10 has pads (first pads) (710FI) for mounting electronic component 90 such as an IC chip and pads (second pads) (710FP) for mounting another printed wiring board (upper substrate) 110. Also, on lower interlayer resin insulation layer (50S), pads (71SP) for connection with a motherboard are provided.

Removable layer 32 is formed on first pads (71FI) (FIG. 4(B)). Solder-resist layer (70F) is formed on upper interlayer resin insulation layer (50F) and on removable layer 32. Solder-resist layer (70S) is formed on lower interlayer resin insulation layer (50S) (FIG. 5(A)). Using a laser, openings (71FP) to expose second pads (710FP) are formed in upper solder-resist layer (70F), and openings (71S) to expose pads (71SP) are formed in lower solder-resist layer (70S) (FIG. 5(B)).

Resist (82S) is formed on the surface of lower solder-resist layer (70S). Ti/Cu seed layer 84 is formed by sputtering on the surface of upper solder-resist layer (70F) and in openings (71FP) (FIG. 6(A)). Here, a Ti/Cu seed layer is formed by sputtering, but a seed layer may also be formed by electroless copper plating.

On solder-resist layer (70F) of printed wiring board 10, plating resist (82F) is formed to have resist opening (82FA) which exposes opening (71FP) and has a diameter greater than the opening (FIG. 6(B)). Electric current flows through seed layer 84, and electrolytic copper plating 86 is filled in resist opening (82FA). Moreover, solder-plated film 88 is formed on electrolytic copper plating 86 by solder plating (FIG. 7(A)). Sn/Ag soldering or Sn/Ag/Cu soldering may be employed. Alternatively, an Sn layer, Ni/Au film or Ni/Pd/Au film may also be formed instead of a solder layer. Upper plating resist (82F) is removed to expose metal post 77 (FIG. 7(B)).

Seed layer 84, which is formed on solder-resist layer (70F) and is left exposed by metal post 77, is removed, and lower resist layer (82S) is removed (FIG. 8(A)). Using a laser, an opening that reaches removable layer 32 is formed and removable layer 32 along with the solder-resist layer on the removable layer is removed so that cavity (70FA) is formed in solder-resist layer (70F). The entire conductive layer (58F) that includes first pad (710FI) is exposed by cavity (70FA) (FIG. 8(B)).

Antioxidant surface-treatment film 72 is coated on first pads (710FI) exposed in cavity (70FA) of upper solder-resist layer (70F) and on pads (71SP) exposed through openings (71S) of lower solder-resist layer (70S). Accordingly, printed wiring board 10 is completed (FIG. 9(A)). Antioxidant surface-treatment film 72 is a protective film to prevent oxidation of pads. Other than OSP, examples of protective film are Ni/Au, Ni/Pd/Au, Sn and the like.

Through solder bump 94 on pad 92, IC chip 90 is mounted on first pad (710FI) in solder-resist layer (70F) of printed wiring board 10 (FIG. 9(B)). At that time, part of IC chip 90 is positioned in cavity (70FA). Mold resin 80 is filled on the printed wiring board to a level corresponding to the upper surface of IC chip 90 (FIG. 10(A)). Opening (80A) to expose solder-plated film 88 on the top portion of metal post 77 is formed in resin 80 using a laser (FIG. 10(B)).

Another printed wiring board (upper substrate) 110 is bonded to metal post 77 by means of solder bump 112. The other printed wiring board 110 is mounted on printed wiring board 10 (FIG. 1).

In the method for manufacturing a printed wiring board according to the first embodiment, solder-resist layer (70F) is formed to have cavity (70FA) and openings (71FP) to form metal posts for connection with an upper substrate. Then, metal posts 77 are formed in the openings first without forming solder bumps in the first openings. Since metal posts are not affected by solder bumps, reliability during the formation of metal posts is enhanced. Accordingly, connection reliability is improved between the upper substrate and metal posts.

In the method for manufacturing a printed wiring board according to the first embodiment, cavity (70FA) to expose first pads (710FI) is formed by removing removable layer 32 and solder-resist layer (70F) on the removable layer. Since first pads (710FI) are exposed from solder-resist layer (70F), IC chip 90 is positioned in the cavity, thus reducing the distance between IC chip 90 and the first pads. Accordingly, the height of metal posts 77 is set lower, resulting in enhanced connection reliability between upper substrate 110 and metal posts 77. In addition, a portion of each metal post is formed by filling openings (70FP) of solder-resist layer (70F) with electrolytic plating, metal posts are secured by rigid solder-resist layer (70F), and the reliability of the metal posts is thereby enhanced.

Second Embodiment

Figure 11:
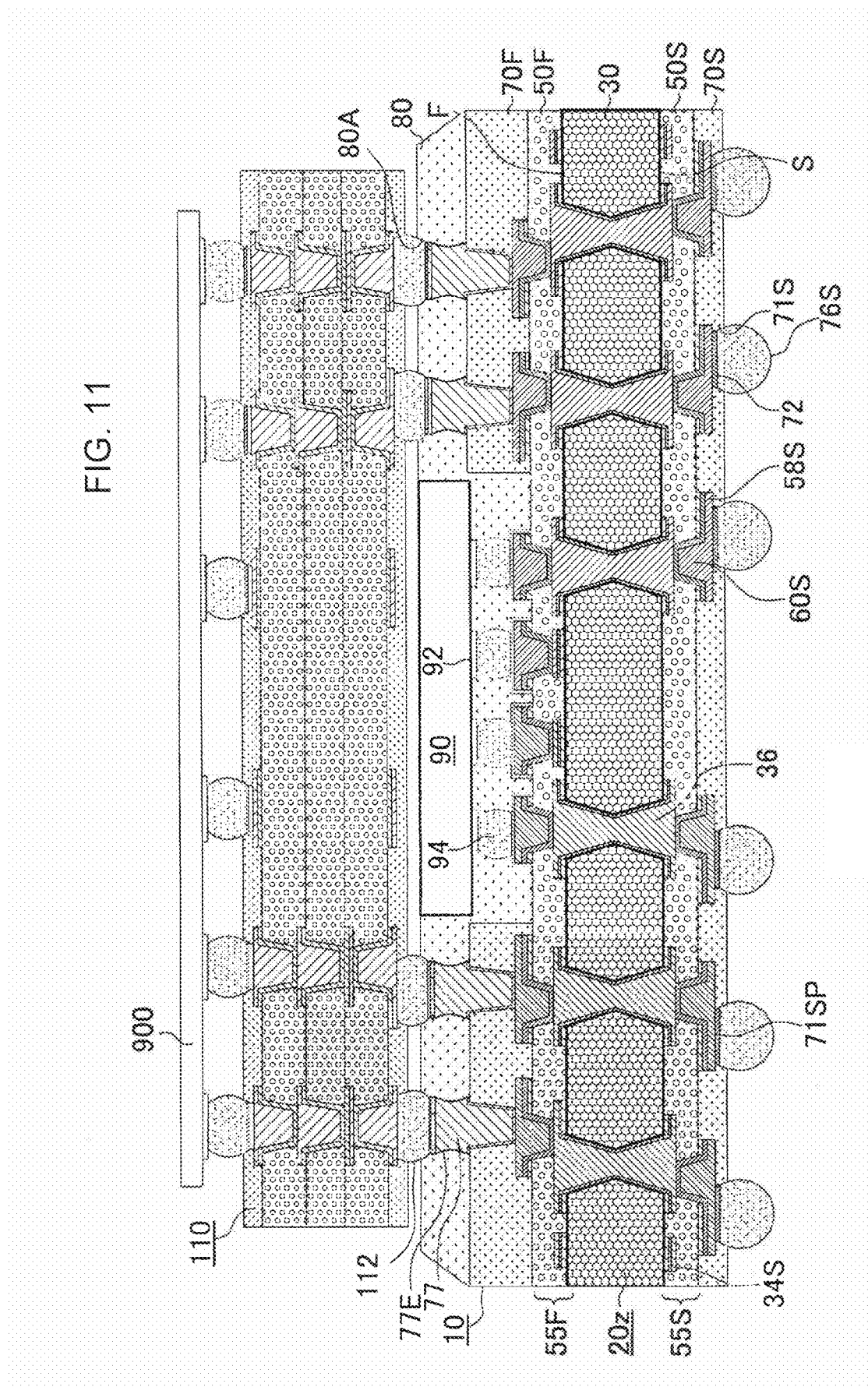
FIG. 11 is a cross-sectional view of an applied example of a printed wiring board according to a second embodiment of the present invention.

FIG. 11 shows an applied example of printed wiring board 10 according to a second embodiment of the present invention.

In the second embodiment, cylindrical portion (77E) of metal post 77 is curved on its sidewall, making the diameter of the post smaller between the top surface and the bottom surface. Since a metal post has a narrowed portion, the metal post tends to be deformed. Thus, stress is likely to be mitigated. Even when pitch (p1) of pads (710FP) is 0.3 mm or less, connection reliability does not decrease between the printed wiring board of the second embodiment and the upper substrate.

In the printed wiring board of the second embodiment, the sidewall of cylindrical portion (77E) of metal post 77 is curved, forming a narrowed portion between the top and bottom of the post and reducing the rigidity of the metal post. Accordingly, stress is mitigated by the post, and connection reliability is enhanced between the upper substrate and the metal post. In addition, since the area of sidewall (77W) of metal post 77 increases, the area also increases where metal post 77 makes contact with mold resin 80 that encapsulates the metal post. The reliability of the metal post is enhanced.

Figure 12:
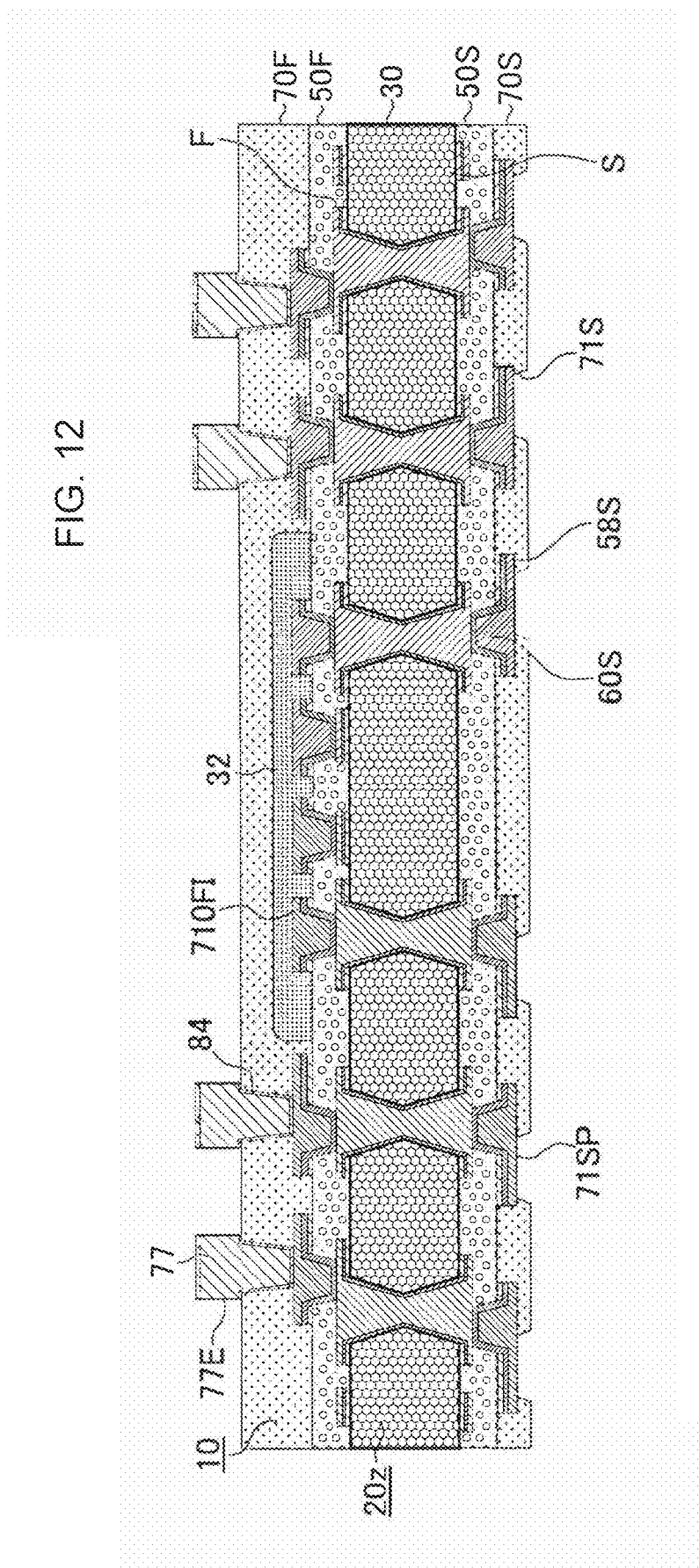
FIG. 12 shows a step for manufacturing metal posts of a printed wiring board according to the second embodiment.
Figure 13A:
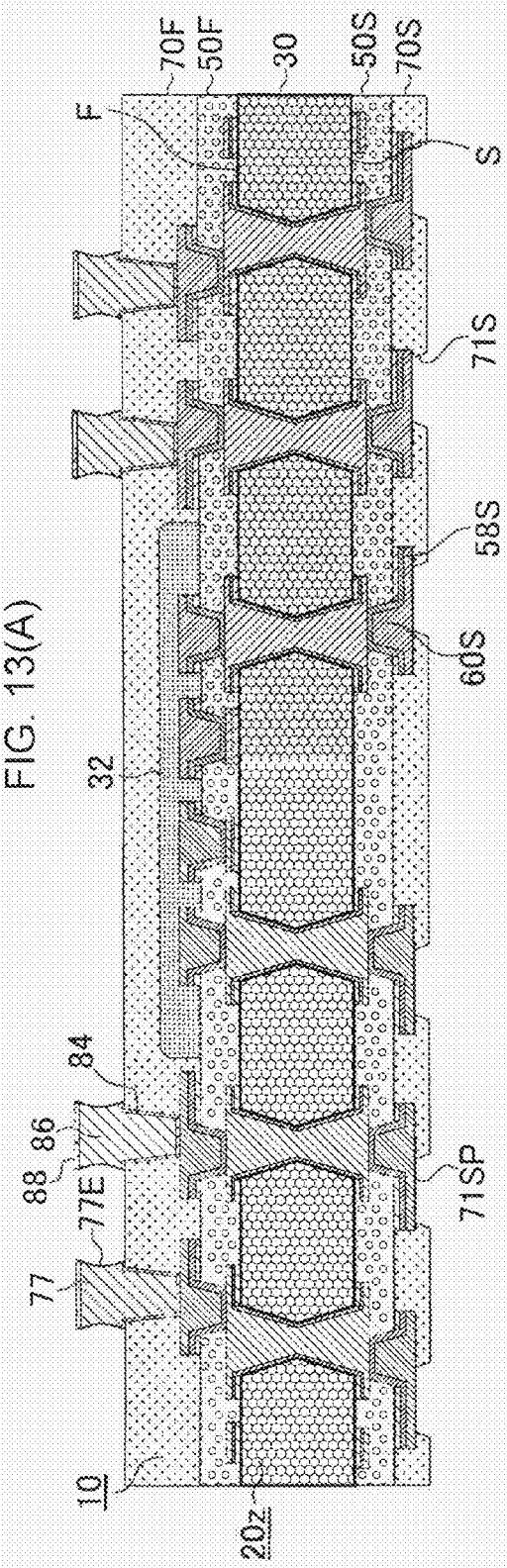
FIG. 13(A)-13(B) show steps for manufacturing metal posts of a printed wiring board according to the second embodiment.
Figure 13B:
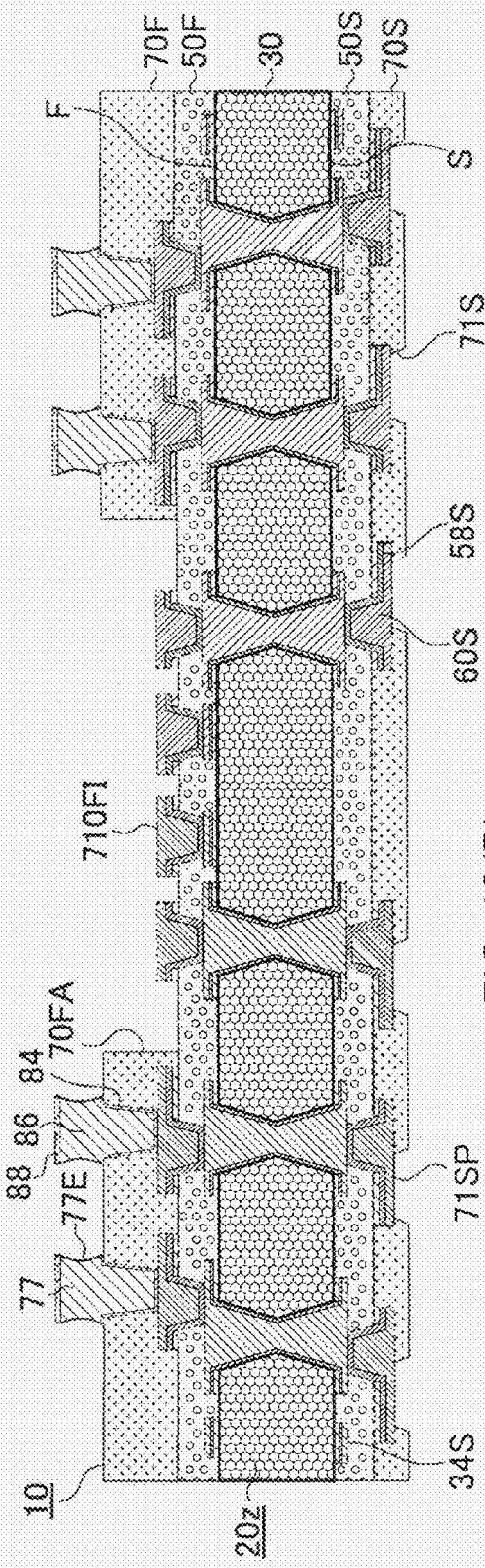

FIG. 11~14 show a method for manufacturing a metal post of the printed wiring board according to the second embodiment. The same as in the first embodiment described above with reference to FIG. 4~8(A), metal post 77 made of electrolytic copper plating 86 and solder-plated film 88 is formed (FIG. 12). Etching is conducted to remove Ti/Cu seed layer 84 and to form a curved portion on sidewall (77W) of metal post 77 made of electrolytic copper-plated film 86 so that the shape of metal post 77 tapers like an hourglass (FIG. 13(A)). During that time, top portion (77T) of metal post 77 will not be etched because it is coated with solder-plated film 88. Using a laser, an opening that reaches removable layer 32 is formed, and removable layer 32 along with the solder-resist layer on the removable layer is removed so that cavity (70FA) is formed in solder-resist layer (70F). Cavity (70FA) exposes the entire conductive layer (58F) including first pad (710FI) (FIG. 13(B)). In the second embodiment, electrolytic copper-plated film 86 is curved at the same time that Ti/Cu seed layer 84 is removed. However, it is an option to remove Ti/Cu seed layer 84 first and then to perform selective etching so that sidewall (77W) of metal post 77 made of electrolytic copper-plated film 86 is curved.

The same as in the first embodiment described above with reference to FIG. 8(B), IC chip 90 is mounted on first pad (710FI) of printed wiring board 10 by means of solder bump 92. Mold resin 80 is filled on the printed wiring board to a level corresponding to the top surface of IC chip 90 (FIG. 14(A)). Using a laser, opening (80A) is formed in mold resin 80 to expose top portion (77T) of metal post 77 (FIG. 14(B)). The same as in the first embodiment, upper substrate 110 is mounted on printed wiring board 10 (FIG. 11).

When a printed wiring board is provided with bumps for mounting an IC chip and metal posts for mounting an upper substrate, the distance between the upper substrate and the printed wiring board is greater than the distance between the IC chip and the printed wiring board. Thus, connection reliability is thought to decrease when the upper substrate and the printed wiring board are connected by tall metal posts.

A printed wiring board according to an embodiment of the present invention and a method for manufacturing such a printed wiring board according to an embodiment of the present invention are capable of enhancing connection reliability between the printed wiring board and an upper substrate mounted on the printed wiring board.

A method for manufacturing a printed wiring board according to an embodiment of the present invention is characterized by the following: on an outermost interlayer resin insulation layer, forming first pads in a central portion of the printed wiring board so as to make connection with an IC chip and forming second pads in a peripheral portion so as to make connection with an upper substrate; forming a removable layer on the first pads; on the outermost interlayer resin insulation layer and on the removable layer, forming a solder-resist layer having an opening to expose a second pad; forming a seed layer on the solder-resist layer, in the opening, and on a second pad exposed through the opening; on the seed layer, forming a plating resist to have a resist opening which exposes the opening and has a diameter greater than the opening; forming a metal post by filling the resist opening with electrolytic plating by means of the seed layer; removing the plating resist; removing the seed layer left exposed on the solder-resist layer; and forming a cavity to expose the first pads by removing the removable layer and the solder-resist layer on the removable layer.

A printed wiring board according to an embodiment of the present invention is characterized by having the following: an uppermost interlayer resin insulation layer; formed on the uppermost interlayer resin insulation layer, first pads positioned in the central portion of the printed wiring board so as to make connection with an IC chip and second pads positioned in the peripheral portion for connection with an upper substrate; a cavity to expose all the first pads; a solder-resist layer with an opening that exposes a portion of a second pad; and a metal post formed on the second pad.

In a method for manufacturing a printed wiring board according to an embodiment of the present invention, a cavity to expose first pads is formed by removing the removable layer and the solder-resist layer on the removable layer. The first pads exposed from the solder-resist layer allow an electronic component to be mounted in the cavity, thus reducing the distance between the first pads and the electronic component. Accordingly, the height of metal posts is set to be lower, and connection reliability is thereby enhanced between the upper substrate and the metal posts. In addition, since a portion of each metal post is formed by filling the second openings of the solder-resist layer with electronic plating, the metal posts are secured by a rigid solder-resist layer, thus improving the reliability of the metal posts.

In a printed wiring board according to an embodiment of the present invention, since first pads are exposed from the solder-resist layer, mounting an electronic component in the cavity is achieved. Thus, the distance is reduced between the first pads and the electronic component. Accordingly, the height of metal posts is set lower, and connection reliability is improved between the upper substrate and the metal posts. Also, since a portion of each metal post is formed by filling the openings in the solder-resist layer with electrolytic plating, the metal posts are secured by a rigid solder-resist layer, and the reliability of the metal posts is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    forming a removable layer over a plurality of first pads formed in a central portion of an interlayer resin insulation layer to mount an IC chip;
    forming on the interlayer resin insulation layer and the removable layer a resin insulation layer having a plurality of opening portions such that the plurality of opening portions exposes a plurality of second pads formed in a peripheral portion of the interlayer resin insulation layer to connect to a second substrate;
    forming a seed layer on the resin insulation layer such that the seed layer is formed on the resin insulation layer, in the opening portions and on the second pads exposed through the opening portions;
    forming on the seed layer a plating resist such that the plating resist has a plurality of resist opening portions exposing the opening portions of the resin insulation layer and having diameters which are greater than the opening portions, respectively;
    filling the resist opening portions with electrolytic plating material via the seed layer such that a plurality of metal posts comprising the electrolytic plated material is formed in the resist opening portions, respectively, and that each of the metal posts has a first portion formed in a respective one of the opening portions in the resin insulation layer and a second portion exposed from the resin insulation layer and that the second portion has a diameter which is greater than a diameter of the first portion;
    applying surface-treatment on end portions of the metal posts prior to removing of the plating resist;
    removing the plating resist from the resin insulation;
    removing the seed layer exposed on the resin insulation layer by the removing of the plating resist; and
    removing the removable layer and a portion of the resin insulation layer on the removable layer such that a cavity portion exposing the first pads is formed in the resin insulation layer,
    wherein the surface-treatment comprises forming a plurality of solder plating films on the end portions of the metal posts, respectively, and the removing of the seed layer includes etching the seed layer from the resin insulation layer such that side-wall portions of the metal posts are etched and form curved side-surfaces forming narrowed portions between the end portions and opposite end portions of the metal posts, respectively.

2. The method for manufacturing a printed wiring board according to claim 1, further comprising:
    forming the first pads on the interlayer resin insulation layer in the central portion of the interlayer resin insulation layer; and
    forming the second pads on the interlayer resin insulation layer in the peripheral portion of the interlayer resin insulation layer,
    wherein the interlayer resin insulation layer is an outermost interlayer resin insulation layer, and the resin insulation layer is a solder-resist layer.

3. The method for manufacturing a printed wiring board according to claim 2, further comprising:
    forming a plurality of antioxidant surface-treatment films on the first pads exposed through the cavity portion of the resin insulation layer, respectively.

4. The method for manufacturing a printed wiring board according to claim 1, further comprising:
    forming a plurality of antioxidant surface-treatment films on the first pads exposed through the cavity portion of the resin insulation layer, respectively.

5. The method for manufacturing a printed wiring board according to claim 1, wherein the surface-treatment comprises forming a plurality of Ni/Pd/Au films on the end portions of the metal posts, respectively, or forming a plurality of Ni/Au films on the end portions of the metal posts, respectively.

6. A printed wiring board, comprising:
    an interlayer resin insulation layer;
    a plurality of first pads formed on the interlayer resin insulation layer such that the first pads are positioned in a central portion of the interlayer resin insulation layer and configured to mount an IC chip;
    a plurality of second pads formed on the interlayer resin insulation layer such that the second pads are positioned in a peripheral portion of the interlayer resin insulation layer and configured to connect to a second substrate;
    a resin insulation layer formed on the interlayer resin insulation layer and the first and second pads such that the resin insulation layer has a cavity portion exposing the first pads in the central portion of the interlayer resin insulation layer and a plurality of opening portions exposing the second pads in the peripheral portion of the interlayer resin insulation layer;

a plurality of metal posts formed on the second pads in the peripheral portion of the interlayer resin insulation layer, respectively, and comprising electrolytic plated material such that each of the metal posts has a first portion formed in a respective one of the opening portions in the resin insulation layer and a second portion exposed from the resin insulation layer and that the second portion has a diameter which is greater than a diameter of the first portion; and a plurality of solder plating films formed on end portions of the metal posts, respectively, wherein the second portion of each of the metal posts has a curved side-wall portion forming a narrowed portion between an end portion and an opposite end portion of the second portion of the metal posts.

7. The printed wiring board according to claim 6, further comprising:

a plurality of antioxidant surface-treatment films formed on the first pads exposed through the cavity portion, respectively.

8. The printed wiring board according to claim 7, wherein the plurality of metal posts is formed on the second pads in the peripheral portion of the interlayer resin insulation layer, respectively, at a pitch in a range of 0.3 mm or smaller, the interlayer resin insulation layer is an outermost interlayer resin insulation layer, and the resin insulation layer is a solder-resist layer.

9. The printed wiring board according to claim 8, wherein each of the metal posts has a diameter in a range of 50 to 150 μm and an aspect ratio in a range of 0.6 to 3.

10. The printed wiring board according to claim 7, wherein each of the metal posts has a diameter in a range of 50 to 150 μm and an aspect ratio in a range of 0.6 to 3.

11. The printed wiring board according to claim 6, wherein the plurality of metal posts is formed on the second pads in the peripheral portion of the interlayer resin insulation layer, respectively, at a pitch in a range of 0.3 mm or smaller, the interlayer resin insulation layer is an outermost interlayer resin insulation layer, and the resin insulation layer is a solder-resist layer.

12. The printed wiring board according to claim 11, wherein each of the metal posts has a diameter in a range of 50 to 150 μm and an aspect ratio in a range of 0.6 to 3.

13. The printed wiring board according to claim 6, wherein the plurality of metal posts is formed on the second pads in the peripheral portion of the interlayer resin insulation layer, respectively, at a pitch in a range of 0.3 mm or smaller.

14. The printed wiring board according to claim 13, wherein each of the metal posts has a diameter in a range of 50 to 150 μm and an aspect ratio in a range of 0.6 to 3.

15. The printed wiring board according to claim 6, wherein the interlayer resin insulation layer is an outermost interlayer resin insulation layer, and the resin insulation layer is a solder-resist layer.

16. The printed wiring board according to claim 15, wherein each of the metal posts has a diameter in a range of 50 to 150 μm and an aspect ratio in a range of 0.6 to 3.

17. The printed wiring board according to claim 6, wherein each of the metal posts has a diameter in a range of 50 to 150 μm and an aspect ratio in a range of 0.6 to 3.

18. A package-on-package device, comprising:

a first substrate;

an IC chip mounted on the first substrate;

a second substrate mounted on the first substrate; and a mold resin layer filling a space formed between the first substrate and the IC chip, wherein the first substrate includes an interlayer resin insulation layer, a plurality of first pads formed on the interlayer resin insulation layer such that the first pads are positioned in a central portion of the interlayer resin insulation layer and configured to mount an IC chip, a plurality of second pads formed on the interlayer resin insulation layer such that the second pads are positioned in a peripheral portion of the interlayer resin insulation layer and configured to connect to a second substrate, a resin insulation layer formed on the interlayer resin insulation layer and the first and second pads such that the resin insulation layer has a cavity portion exposing the first pads in the central portion of the interlayer resin insulation layer and a plurality of opening portions exposing the second pads in the peripheral portion of the interlayer resin insulation layer, and a plurality of metal posts formed on the second pads in the peripheral portion of the interlayer resin insulation layer, respectively, and comprising electrolytic plated material such that each of the metal posts has a first portion formed in a respective one of the opening portions in the resin insulation layer and a second portion exposed from the resin insulation layer and that the second portion has a diameter which is greater than a diameter of the first portion, the mold resin layer has a plurality of opening portions exposing end portions of the metal posts, respectively, the first substrate has a plurality of first bumps mounting the IC chip on the first pads in the central portion of the interlayer resin insulation layer, and the second substrate has a plurality of second bumps connecting to the end portions of the metal posts exposed from the opening portions of the mold resin layer;

wherein the metal posts have curved side-wall portions forming narrowed portions between the end portions and opposite end portions of the metal posts, respectively.

19. The package-on-package device according to claim 18, wherein the plurality of metal posts is formed on the second pads in the peripheral portion of the interlayer resin insulation layer, respectively, at a pitch in a range of 0.3 mm or smaller, the interlayer resin insulation layer is an outermost interlayer resin insulation layer, and the resin insulation layer is a solder-resist layer.

20. The package-on-package device according to claim 19, wherein each of the metal posts has a diameter in a range of 50 to 150 μm and an aspect ratio in a range of 0.6 to 3.

\* \* \* \* \*